(12) United States Patent
Jantunen et al.

(10) Patent No.: US 7,511,467 B2
(45) Date of Patent: Mar. 31, 2009

(54) DETECTION OF LIGHTNING (75) Inventors: Joni Jantunen, Helsinki (FI); Jakke Mäkelä, Turku (FI); Terho Kaikuranta, Piispanristi (FI); Jukka Reunamäki, Tampere (FI); Tom Ahola, Helsinki (FI); Arttu Uusitalo, Ruutana (FI); Kari Kalliojärvi, Kangasala (FI)

(73) Assignee: Nokia Corporation, Espoo (FI)

( * ) Notice: Subject to any disclaimer, the term of this patent is extended or adjusted under 35 U.S.C. 154(b) by 10 days.

(21) Appl. No.: 11/250,338

(22) Filed: Oct. 14, 2005

(65) Prior Publication Data
US 2007/0085525 A1 Apr. 19, 2007

(51) Int. Cl.
*G01R 31/02* (2006.01)
*G01W 1/00* (2006.01)

(52) U.S. Cl. .......................... 324/72; 73/170.24; 702/4

(58) Field of Classification Search .................. 324/72; 73/170.24; 702/4
See application file for complete search history.

(56) References Cited

U.S. PATENT DOCUMENTS

| 3,891,919 | A | * | 6/1975 | Penninger | 324/72 |
| 4,272,719 | A | * | 6/1981 | Niki et al. | 324/72 |
| 4,812,825 | A | * | 3/1989 | Kennedy et al. | 340/601 |
| 5,212,827 | A | * | 5/1993 | Meszko et al. | 455/219 |
| 5,263,368 | A | | 11/1993 | Breitmeier et al. | 73/170.24 |
| 5,541,501 | A | | 7/1996 | Shaver et al. | 324/72 |
| 6,232,882 | B1 | | 5/2001 | Hed et al. | 340/601 |
| 7,171,308 | B2 | * | 1/2007 | Campbell | 702/4 |

FOREIGN PATENT DOCUMENTS

| WO | WO-2005/093439 A2 | 10/2005 |
| WO | WO-2005/093440 A1 | 10/2005 |

* cited by examiner

*Primary Examiner*—Vincent Q Nguyen
*Assistant Examiner*—John Zhu
(74) *Attorney, Agent, or Firm*—Harrington & Smith, PC (57) ABSTRACT A lightning detector for lightning detection and a lightning detection method, wherein the lightning detector uses at least two separate channels or frequency bands for lightning detection, and wherein the lightning detector is a mobile RF device provided with radio interfaces for at least two communication channels or frequency bands, whereby at least one of which is normally a telecom channel/frequency range and wherein these channels/ranges are used in lightning detection.

32 Claims, 7 Drawing Sheets

DETECTION OF LIGHTNING

FIELD OF THE INVENTION

The invention relates to a lightning detector. The invention relates especially to a lightning detector wherein the detector uses at least two separate channels for lightning detection. The invention also relates to a method for detecting lightning.

BACKGROUND OF THE INVENTION

Thunderstorms are a major weather hazard, but are difficult to predict. They can travel at speeds of 20 km/h to 40 km/h, and lightning strokes may occur more than 10 km in front of the rain clouds and equally some distance behind the rain clouds. While a lightning stroke is produced by a cloud or a weather front, many of the most dangerous lightning strokes actually occur when no visible clouds are present above as a warning of a thunderstorm. Thus, a system that warns of possibility harmful thunderstorms, even if only approximately ten minutes before they become visible, can be considered a major safety feature.

There is a large population that would benefit from such a safety feature. To some persons, it might provide only a nice-to-know everyday knowledge. To a considerable number of persons, however, storm and lightning originated threats have significant implications in the form of an increased risk, loss of property or even fatal consequences. A lightning alerting system is of particular interest, for instance, for persons spending much time outdoors, and equally for aviators, navigators or the like. A system providing a warning of lightning even when the weather seems to be perfectly calm and clear may enable a person to take suitable safety measures in time, for instance seek shelter etc.

From the state of the art, many single-purpose lightning detectors are known, but they have some disadvantages from a commercial perspective. Scientific lightning detectors, which are used in meteorology, are very large and their range is hundreds of kilometers.

Also other high-end lightning detectors using a single radio frequency (RF) band are large and relatively expensive, compared for instance to mobile phones. Moreover, they are usually required to have a specific orientation, for instance standing on a wall or on a desk stand, in order to gain the required accuracy or directionality. They are thus not well suited for a truly mobile use. These devices typically have further to be positioned in a certain way and held stationary for several minutes before a reliable detection of a thunderstorm becomes possible.

In addition, there are now existing rather inexpensive low end lightning detectors which are completely portable in size and which do not require a specific orientation. These detectors, however, are extremely susceptible to man-made electromagnetic compatibility (EMC) emissions and thus tend to cause spurious alarms especially in an urban setting or near highways Currently most of commercially available mobile lightning detectors detect lightning strokes by measuring the electromagnetic emission caused by lightning at very low frequencies (VLF: 3-30 kHz). In addition, it has been known for decades that lightning strokes can be "heard" by using a traditional AM broadcast radio receiver, which operates at longwave frequencies (150 to 300 kHz), mediumwave frequencies (500 to 1700 kHz) and shortwave frequencies (SW: 2 to 30 MHz). However, numerous publications exist where lightning have been detected and measured by its emission at HF and VHF frequencies between 3-300 MHz and even at higher (UHF) frequencies.

SUMMARY OF THE INVENTION

The present invention proceeds from the consideration, that a lightning stroke is a single flash which produces besides a visual signal and a partly audible pressure signal as well a brief but strong electromagnetic pulse extending over a wide variety of wavelengths. Typical electromagnetic pulses caused by a lightning stroke cover the frequencies between 10 Hz and 5 GHz with a peak around 500 Hz, i.e. in the audio frequency range. At a normalized distance of 10 km, the amplitudes of such pulses range from 107 mV/m to 1 mV/m in a bandwidth of 1 kHz. the strongest signal of the electromagnetic pulse is the induced electric field caused by the vertical current in the lightning stroke, and this is the parameter that is most commonly measured in large-scale distance-bearing devices.

However, due to the complexity of the lightning stroke phenomenon, there are also strong signals in the extremely low frequency (ELF) range of a few hundred Hz or less, and weaker signals extending up to the GHz range and above.

It is a well-known fact that the exact characteristics and time spectra of the electromagnetic interference (EMI) signatures are different in the MHz range than in the kHz and Hz ranges due to the slightly different meteorological mechanisms causing them.

For the purposes of the present invention it is sufficient to note that at all frequencies of interest, a lightning stroke is accompanied by an EMI pulse that can be identified at a distance of many kilometers.

As a result of the lightning stroke generated EMI pulse, RF channels are briefly interfered during a lightning stroke in the vicinity. The impairment of RF receivers due to an EMI caused by a lightning stroke can be experienced in using an AM/FM radio, TV or over power supply lines in form of statics, clicks, scratches, noise or loss of sound or picture. Disturbances in RF channels due to a lightning stroke can be sensed at very large distances. Specialized and large-scale lightning detectors are able to detect lightning disturbances, so-called sferics, at a distance of several hundreds of kilometers from a lightning stroke, although these detectors typically operate by measuring the induced electric or magnetic field rather than the interferences in an audio or RF signal as the present invention.

Ordinary AM radios are known to suffer from EMI disturbances at a distance up to 30 km or more from a lightning stroke, which can even be heard directly in an audio signal as various clicks. At higher frequencies than the AM bands the signal is typically much weaker due to both atmospheric attenuation and different causation mechanisms, but is nevertheless detectable at large distances.

While in known mobile RF devices, such as ordinary mobile phones, electromagnetic interference in received RF signals are eliminated immediately by filtering, it is proposed in the present invention that such electromagnetic interferences in a monitored RF channel are evaluated. If a detected interference seems to be caused by a lightning stroke, a user of for example a mobile phone can be alerted. An interference can be assumed to be caused by a lightning stroke, for example, if it exceeds a predetermined threshold value or if it has a frequency spectrum which is characteristic of a lightning stroke. The lightning detection can be on as long as the RF detection is on.

The present invention thus provides a new security feature that can be implemented in a mobile RF device, for example a cellular phone.

While in many case, the desire to detect lightning strokes in the vicinity may not be large enough to justify the costs and the difficulty of carrying along a dedicated lightning detector, many people would appreciate a low-cost sensing system that could be integrated with a device that they are already carrying along in any case, especially like a mobile phone. The known art does not provide for such an integration of a lightning detection as a new functionality in known mobile RF devices.

Figure 10:
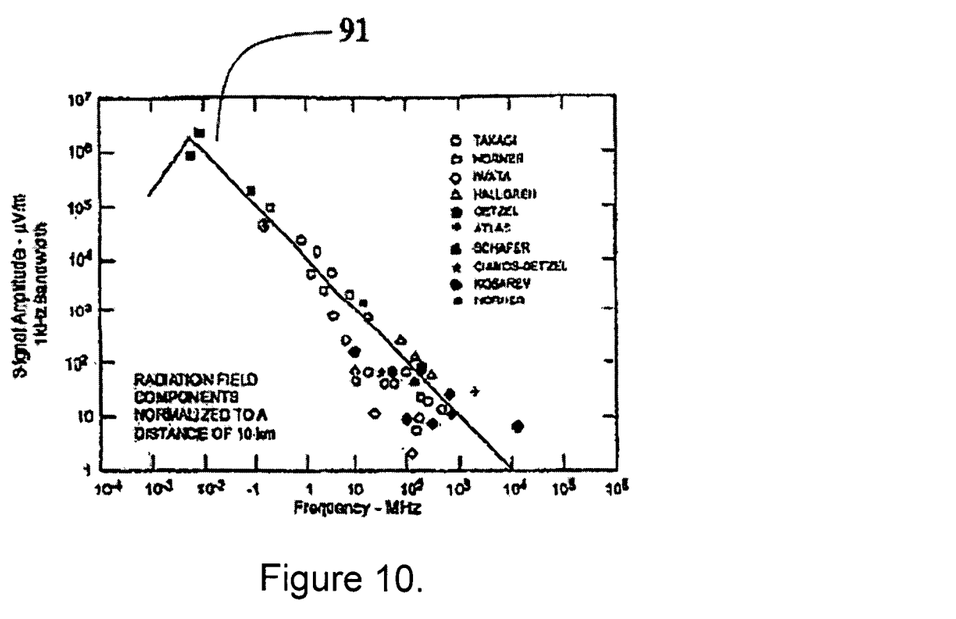

It has been found out that lightning detection and ranging feature would be a desired feature e.g. in mobile phones. Sufficient detection range for the lightning stroke detection feature in mobile products would be about 20-30 km. This detection range might be limited to a suitable range depending on the receiver sensitivity and the expected emission power from lightning strokes. FIG. 10 shows in graphical form frequencies and amplitudes that have been generated by lightning strokes, as determined by many researchers. The graph according to FIG. 10 can thus be used as a guideline to estimate the strength of signals that can be expected from lightning strokes at different distances. In the graph the distance is normalized to 10 km and the bandwidth is normalized to 1 kHz. According to the this graph, lightning stroke signals can be detected at least up to 300 MHz.

The present invention is based on the idea that the incoming spectrum generated by a thunderstorm is studied using all or many available RF channels available in a mobile RF device, such as a cellular phone. Because of the many radio interfaces (i.e. hundreds of channels in each of the three bands in a tri-band receiver, the Bluetooth receiver frequencies, the FM radio including the pilot tone channel, the Wi-Fi radio local area receiver, the RFID tag reader and even the RDS and/or DARC receivers) the present invention provides a new and feasible method for lightning detection.

Thus according to the first aspect of the invention, the present invention is based on the use of at least two channels, at least one of which is a telecom channel, for lightning detection.

For the first aspect of the invention it is therefore proposed that the lightning detector is a mobile RF device provided with radio interfaces for at least two frequency ranges, whereby at least one of which is normally a telecom channel, for lightning detection.

In a further preferred embodiment of the present invention, taking into consideration that the emission from a lightning stroke is a wideband burst, several channels or a complete frequency band reserved for telecommunication is used at least to provide a triggering mode receiving maximum energy and thus increasing sensitivity.

According to a still further embodiment of the present invention at least one of the bands is the FM broadcasting frequency band.

A preferred embodiment of the present invention is to utilize the suitable parts of a FM radio receiver in lightning detection, and to add a dedicated lightning detection branch to the receiver.

Preferred embodiments of the present invention further include multiple embodiments of modifying an FM receiver to identify and measure lightning strokes. According to theory FM modulation is chosen specifically for broadcasting in order to minimize statics and crackling caused by atmospheric disturbances like lightning. However, if the FM demodulator, especially the limiter stage, is by-passed and the resulting signal is e.g. AM demodulated, then the disturbance originating from lightning strokes can be analyzed.

Characteristic features of the lightning detector and the method of detecting lightning according to the present invention are in detail presented in the enclosed claims.

The present invention has the benefit that it can provide a portable lightning detector integrated with a mobile telephone. Another aspect of the invention is that hardware changes can be minimized, in the methods by which hardware (HW) changes can be minimized, thus limiting costs and shortening time to market.

BRIEF DESCRIPTION OF THE DRAWINGS

In the following, the invention will be described in more detail with reference to the appended drawings, in which.

DETAILED DESCRIPTION OF THE INVENTION

The basic principle of the invention is to utilize the suitable parts of a telecom radio receiver in lightning detection, and add a dedicated lightning detection branch to the receiver.

Lightning strokes emit bursts of pulses detectable on frequencies used for broadcast radio. Originally the FM radio broadcasting system was introduced because the existing AM radio system was too sensitive to interference e.g. generated by lightning strokes. The reason for the sensitivity of AM radio to lightning strokes is that interference from lightning strokes sum with the amplitude modulated signal. The interference in amplitude is heard as crackling static in AM radio receivers. The intensity of the signal emitted by lightning strokes is also higher on AM broadcast frequencies (near 1 MHz) than the FM broadcast frequencies (near 100 MHz). Since in FM systems the audio signal is modulated to the carrier as frequency or phase changes, interference in amplitude does not cause audible crackling or other errors in the received signal, because as the amplitude is not bearing modulation it can be limited by a limiter before the FM discriminator or ratio detector. However, if the lightning stroke occurs nearby (within a couple of kilometers) of the FM receiver, correlation between interfering noise heard from for example a battery powered FM receiver and the lightning flashes can be observed.

But if demodulation is not considered, lightning strokes still emit bursts of pulses detectable on frequencies used for FM radio reception, like the 87.5 to 108 MHz frequency band in Europe and the 88 to 108 MHz band in USA and the 76 to 91 MHZ frequency band in Japan. Since FM modulation is robust against interference caused by lightning strokes, the interference cannot be heard by using traditional FM radio receivers. The lightning detection feature require a demodulator working like an AM demodulator. As already mentioned, the AM demodulator is very much more sensitive to interference caused by lightning strokes. The additional lightning stroke detector can be added in parallel with the FM demodulator/receiver. The correct stage where the lightning detector HW should be added is after the down-conversion mixer and before limiter stage in FM radio receiver.

Figure 1:
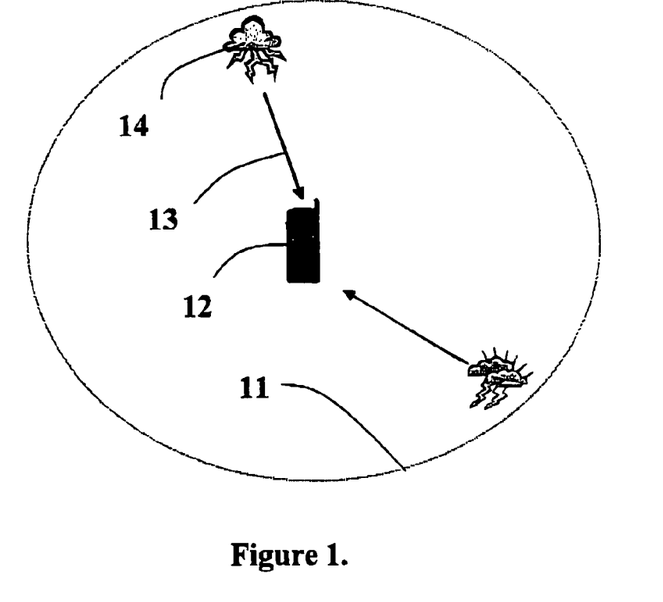
FIG. 1 presents an operational environment.
Figure 2:
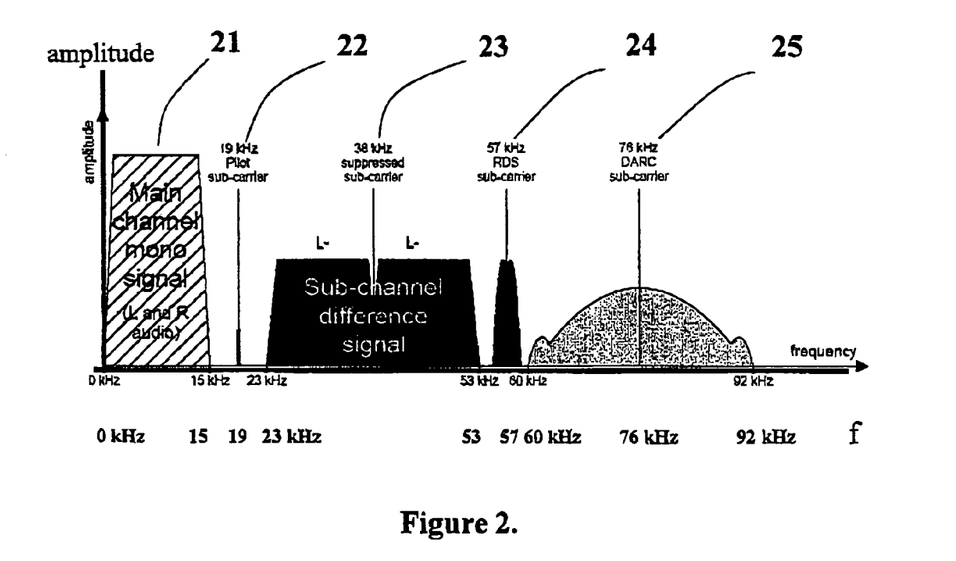
FIG. 2 presents auxiliary receiving bands

As can be seen depicted in FIG. 2, a FM stereo broadcast comprises in addition to the main monophonic FM broadcast 21 additionally a suppressed 38 kHz center frequency and 30 kHz wide subcarrier 23 for stereo audio content and a 19 kHz pilot tone sub-carrier 22 to facilitate the regeneration of the right and left stereo channels.

To send program content and other data to display equipped radio receivers another 57 kHz center frequency and 7 kHz wide RDS (Radio Data System) subcarrier 24 was later added to most FM broadcasts. A new 32 kHz wide DARC (Data Radio Channel) subcarrier 25 centered around 76 KHz has additionally been standardized in 1995 by ETSI as ETS 300751.

Currently, the FM channel spacing is 100 kHz in Europe and 200 kHz in USA. The reception of RDS signal would require a somewhat wider bandwidth than 100 kHz, but it's unclear if channels with RDS broadcasting have a wider channels spacing also in Europe. In the future all new FM receivers may be capable of receiving the whole (about 200 kHz wide) frequency band containing the RDS and DARC sub-carriers.

The burst of pulses generated by lightning strokes is possible to detect with a receiver on carrier frequency near to 100 MHz (at least on an empty FM channel). As presented in FIG. 2, the receiving of pulse burst is possible at least if the reception channel is about 300 kHz wide. Narrower bandwidths might be feasible, as well. Depending on the actual implementation the channel width of FM receiver front-end is about 100-200 kHz as presented above.

Since the spectrum of RF emission from lightning strokes is more intensive on low frequencies, the lower end of FM frequencies is better than the higher one. The most feasible FM channels are near to lower end of FM frequency band which is 76 MHz (in Japan), 87.5 MHz (in Europe) or 88 MHz (in USA).

Several embodiments of lightning detection using modified FM receivers will now be described in the following.

Figure 7:
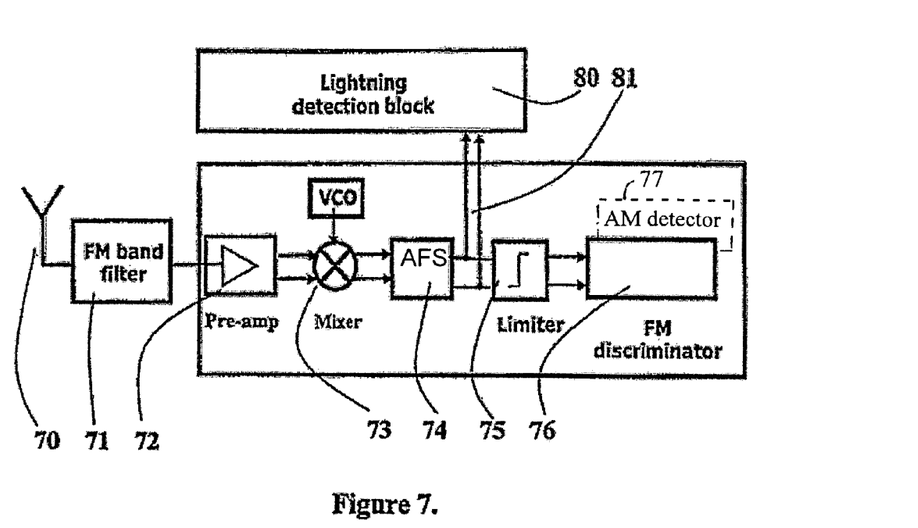
FIG. 7 presents a block diagram of a receiver with lightning detection.

An arrangement is depicted in FIG. 7 where the signal 81 or 83 for the lightning detection block 80 is tapped before the limiter 75 because most of the lightning noise information would be lost by the amplitude limiting action in the limiter 75, but the tapped signals 81, 82 in the figure shown as a typical differential signal like in present day circuits, is unaffected and still contains information related to the lightning stroke noise.

The FM receiver path from antenna to the discriminator 70, 71, 72, 73, 74, 75 and 76 can be considered to be similar to the corresponding path in a commercial IC sold by Philips as TEA5767.

EMBODIMENT 1

In the first embodiment the FM receiver path from antenna to the discriminator 70, 71, 72, 73, 74, 75 and 76 has an additional intermediate output 81 would be between the down-conversion mixer 73 and the limiter stage 75. The circuit block 74 contains amplification and frequency selection means (AFS). The intermediate signal containing the amplitude information caused by the RF emission from lightning strokes is input via 81 to a lightning detection specific block 80. In this implementation alternative the detection bandwidth would be similar to the selected FM channel (100-200 kHz).

EMBODIMENT 2

In another embodiment alternative the intermediate output 82 is arranged immediately after the low-noise preamplifier 72. In this alternative the detection bandwidth would be the whole FM band (e.g. 87.5-108 MHz in Europe) as passed on by the FM band filter 71 between the antenna 70 and the low noise preamplifier 72. This alternative embodiment could advantageously be used in trigger mode for lightning-like signals. The received power on the band could be measured with a wideband power detector and if fast wideband signals (like lightning strokes) exist in the signal, a more accurate detection could be started e.g. on one of the FM channels.

One possibility is to have an additional separate down-conversion mixer for the lightning detector. This is indicated as 83 in the lightning detection block 80 of FIG. 8 and the arrangement would allow simultaneous lightning detection and FM radio reception on different or the same FM bands.

Figure 8:
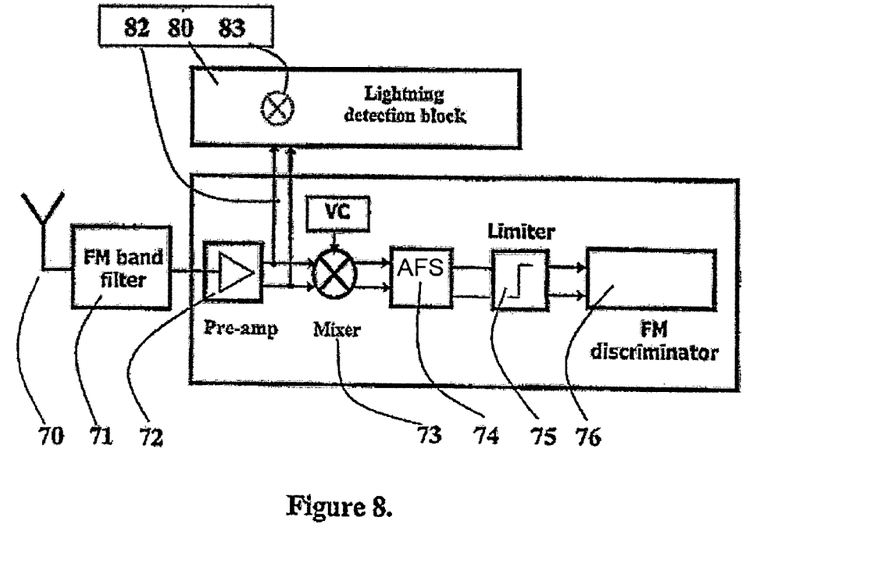
FIG. 8 presents an alternative block diagram of a receiver with lightning detection.

However, this kind of implementation requires additional HW dedicated for the lightning downconversion which would not be needed if the signal 82 is tapped after the downconverting mixer 73 like in the first embodiment.

EMBODIMENT 3

Lightning detection can advantageously take place in an empty FM channel. Finding of an empty FM channel is easy using the conventional FM stereo receiver path. The found empty channels can be used for lightning detection. As presented above, lightning detection on an empty FM channel would require an intermediate output after down-mixer in the FM receiver. The reason for this is that the FM modulated signal is limited to a low amplitude before frequency demodulation in the FM discriminator 76. The limiting extracts the signal caused by RF emission from a lightning stroke and after the limiter no lightning detection is possible. In addition, if no FM signal exists on the FM channel, the noise of FM demodulator increases significantly. Merely this increment of noise makes detection of lightning hard although it otherwise would be possible from the demodulated but empty FM channel. For lightning detection the FM discriminator should be replaced with an AM detector sensitive to amplitude changes (shown in FIG. 7 as the dashed box, wherein the AM detector is labeled as 77).

On an empty FM channel the whole channel can be utilized. In case of a basic FM stereo receiver the Rx channel is +/−53 kHz wide around the carrier frequency. In case of stereo FM RDS receiver the Rx channel is +/−60 kHz wide and in case of a DARC compatible FM receiver the channel width is +/−92 kHz around the carrier center frequency.

EMBODIMENT 4

Detection While FM Reception is Active

The optimum situation, from the point of view of the user, is to implement a lightning detection feature that simultaneously permits both lightning detection and reception of a FM radio broadcast. But the FM radio signal is continuous and therefore there is no gaps in the transmission so if the lightning stroke is weak (for example due to a distant stroke), it might be difficult to detect lightning strokes on an FM channel where radio transmission is active, but this embodiment can still be used for lightning alerting or triggering purposes.

Some ideas for implementation now follows:

a) Lightning detection can be done on the basis of the signal received around the 19-kHz sub-carrier. Current stereo FM broadcasting leaves the channel between 15-23 kHz empty except the narrow 19-kHz pilot sub-carrier. These frequency portions around the pilot carriers are available on every FM channel.

b) One alternative is to detect lightning strokes simultaneously with FM stereo reception on an inactive RDS or DARC channels. In addition, if RDS and/or DARC contains gaps in transmission, the gaps could be used to detect lightning strokes simultaneously with stereo FM reception.

c) It is possible to detect interference simultaneously when receiving a FM transmission. If for example detectable interference exists e.g. on the channel around 19-kHz pilot sub-carrier, a more accurate lightning detection mode could be activated. The more accurate detection would be made on an empty FM radio channel and could contain distance estimation as well. The trigger mode would only detect lightning-like interference.

d) If the reception bandwidth can be arranged to be wider than the 100 kHz respective 200 kHz bandwidth needed for of a FM broadcast channel, the lightning detection or lightning triggering can be performed between the FM channels because in practice, neighboring channels are seldom used.

EMBODIMENT 5

Utilization of AGC (Automatic Gain Control)

One idea that is feasible is the utilization of the AGC stage of an FM receiver for lightning detection. AGC functionality is widely used in FM receivers (see e.g. the Philips TEA5767 FM receiver). If some of the loops in the AGC circuitry can be made sensitive to a signal component generated by lightning strokes, it might be possible to get a sufficient intermediate signal directly from the AGC stage and no other modifications are needed in FM receiver stage. However, the time constant of the AGC circuit bust be tuned short enough to enable detection of the short pulses caused by lightning strokes.

External capacitors are often needed in implementation of an on-chip AGC stage and therefore only small modifications to the integrated circuit is needed if the intermediate output can be connected to these external capacitors If pulse detection is feasible, the idea can be used at least for the triggering mode if more accurate detection is not possible. Another measurement mode could be implemented for distance estimation etc.

EMBODIMENT 6

Multi-Mode Detection

Figure 3:
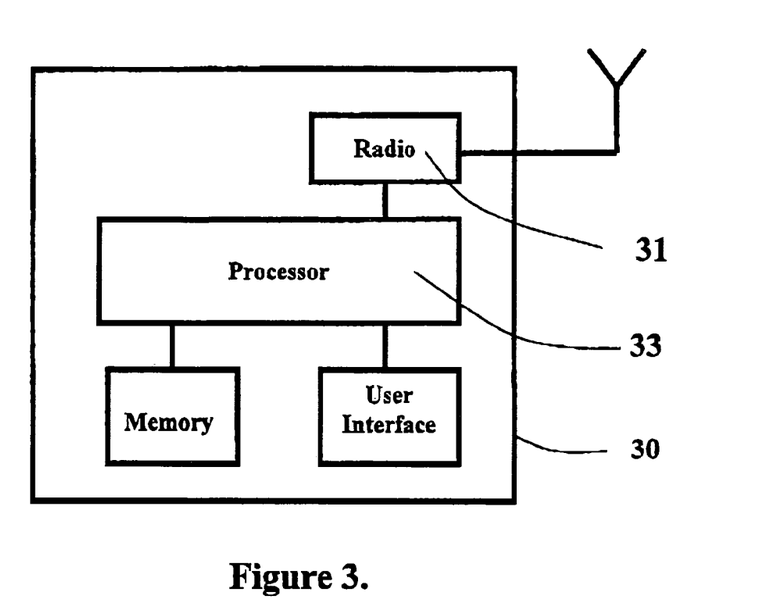
FIG. 3 presents a block diagram of a single radio implementation.
Figure 4:
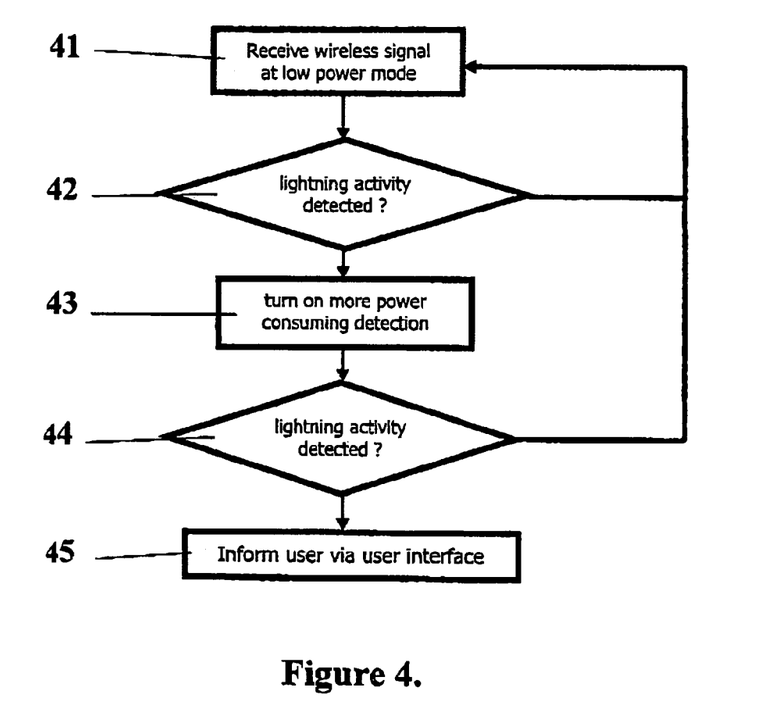
FIG. 4 presents a flow chart of a single radio operation.

In the simplest mode, only one radio (i.e. FM radio receiver) is utilised during the detection. FIG. 3 depicts such a system 34 comprising a single radio 31. Different modes are used by the processor 33 to optimize power consumption. For example, in the less power consuming mode perhaps only the front-end is turned on in the power saving mode and analog peak detection is used to trigger more power consuming components as ADC and processor, like presented above in the implementation example 2. Between full operating lightning detection and triggering mode, there can be a monitoring mode that will decide whether the device should switch to lightning measuring mode or go back to triggering mode. An example of an operational chart of operation for the single radio implementation is presented in FIG. 4. During the low power monitoring mode in step 41 the received signal is continuously monitored in step 42 and if lightning activity is detected a more power consuming but more precise detection mode is selected in step 43 and if in step 44 the analysis meets the criteria for user alerting, this is done in step 45, otherwise the system returns to the low power monitoring mode in step 41.

Figure 5:
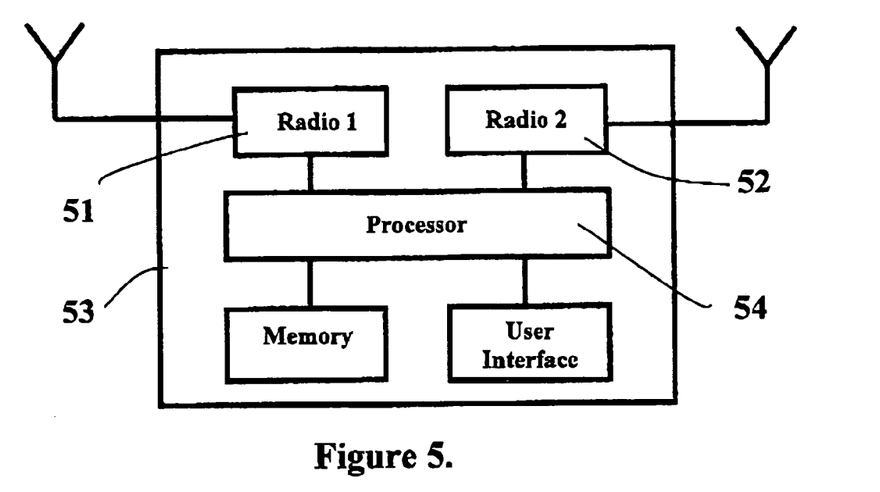
FIG. 5 presents a block diagram of a multi radio implementation.
Figure 6:
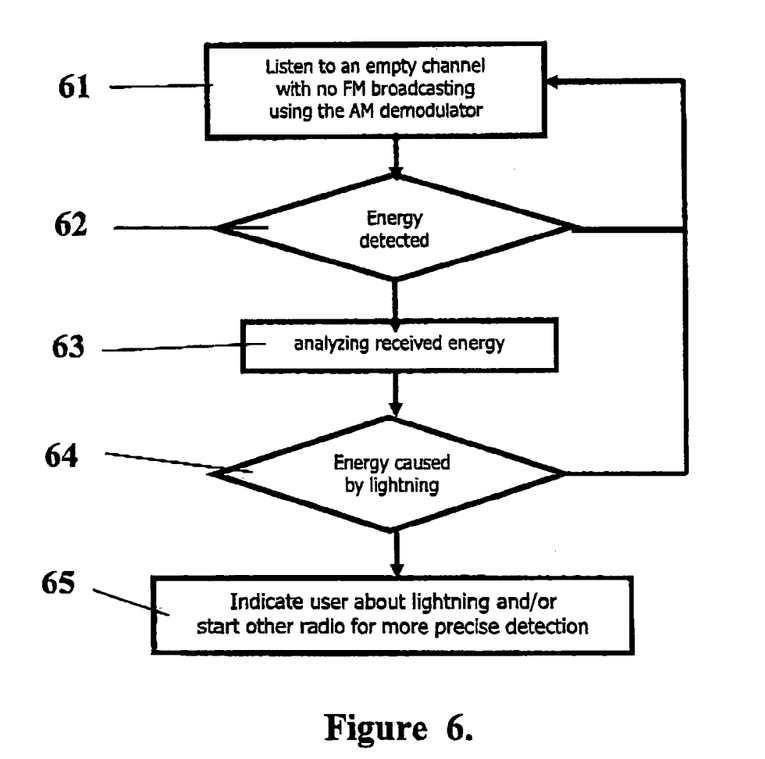
FIG. 6 presents a flow chart of the multi-radio operation

Another possibility is to use two separate radios in a system 53 depicted in FIG. 5, either using a common antenna or separate antennas, a main lightning detection radio 51 and another radio 52 that is using less power, but is less accurate. In this case, the less power consuming radio 52, e.g. RFID tag reader, is used in triggering mode. An example of an operational chart of operation for the multiple radio implementation is presented in FIG. 6. Low powered monitoring of an empty channel takes place in step 61 using AM detection advantageous for lightning detection, When lightning energy is detected by the AM detector in step 62 the processor 52 controls the other radio in step 63 to analyze the received signal and if the analysis in step 64 meets the criteria for user alerting, this is done in step 65, otherwise the system returns after a predetermined time to the low power monitoring mode in step 41 using the radio 51.

EMBODIMENT 7

Energy-Optimized, Multiple-Mode Multiple-Band, Triggering System for Lightning Detection A mobile device able to work in at least two modes, each mode capable of some level of lightning detection and ranging is described in known art. These modes can utilise the same radio in a different way or utilise separate radios for the various modes. This embodiment comprises a controller 33, 53 in FIG. 3 respective FIG. 5 which is able to keep the device in a low-energy "triggering" mode as much as possible, only launching more power consuming modes when triggered. The controller selects an optimal radio for a semi-passive low-energy-consumption "triggering" mode: the radio simply responds to all EMI pulses that could be related to lightning, but makes no further processing. Instead, when triggered, it opens a "monitoring" mode that can consume more energy. This can be a different radio, or the same radio operating in a different mode. The monitoring mode evaluates EMI pulses more accurately. If it detects an event that has a good chance of being a lightning event, only then the "measuring" mode is opened. In this mode, the full processing power is used to detect, identify, and evaluate possible lightning strokes to the best possible accuracy. In a preferred embodiment, the measuring mode opens more than one of the possible detection channels.

Note that the mode structure can be either simpler or more complex than the one described. In the simplest possible mode, there is only a triggering mode (e.g. RFID) which launches the measuring mode directly. In more complex systems, there may be multiple triggering & monitoring & measuring modes.

The number of possible radio receiver combinations that might be possible to use in lightning detection is relatively large. Below is a short list of the possible combinations and estimations how power could be saved by using trigger and detection modes separately.

Using Audio+AM/FM

Most of the current commercial lightning detectors operate on relatively low frequencies i.e. on audio frequencies from hundreds of Hz to 10-100 kHz. Some commercial or research detectors operate also on AM or FM frequencies. It seems very probable that a good and power efficient lightning detector implementation would simultaneously utilize receivers on audio and AM/FM frequencies especially in devices where AM and/or FM receiver exists anyway. The detection on multiple frequency bands (far enough from each other) gives better estimations about distance to lightning strikes. On the other hand, if several receivers are active simultaneously the power consumption is of course higher. Therefore it is advantageous to have separated triggering and measuring modes. Depending on the current consumption and sensitivity of different receivers and portions the triggering receiver may be either audio, AM or FM receiver. For example, a peak detector implemented on audio frequency path could be the trigger which activates more accurate detection on several frequencies.

Using RFID:

As previously mentioned, a modified RFID reader could be used as a triggering device to launch a more accurate lightning detection mode. The RFID reader front-end could be modified for example by adding a frequency selective (5-10 kHz) peak-detector. If some predefined peak-level exceeds in triggering mode, the measuring mode would be launched. The measuring mode could include for example using of audio and/or AM/FM based detection and ranging.

Detection Based on Detection on Frequencies 100 MHz and Above:

According to lightning related literature, depending on the phase and type of a lightning, electromagnetic emission on relative high frequencies exists. For example, cloud-to cloud lightnings emit signal on GHz frequencies. Additionally, the stepped leader phase of cloud to ground lightnings emit high frequencies. Thus, the detection of emission on higher frequency could be an indicator for increased lightning probability which could trigger measurement mode. However, as can be seen from the graph depicted in FIG. 9, the power of emission on GHz frequencies is relatively low and therefore sensitivity of triggering receiver should be high.

Man-Made EMC Elimination

Further, the so-called man-made noise elimination may be implemented as a software function that is capable of finding fixed interval peaks in the received signal and filtering them away. This can be implements for example by keeping a record of detected intervals and analysing if some specific intervals appear constantly or cover constantly a certain time period. During the man-made noise the lightning detection can be switched off.

Using Other Auxiliary Receivers

While the above description is mainly related to the use of FM radio in the lightning detection, also other frequency ranges, i.e. hundreds of channels in each of the three bands in a tri-band receiver, the Bluetooth receiver frequencies, the FM radio including the pilot tone channel, the Wi-Fi radio local area receiver, the RFID tag reader and even the RDS receiver can be used.

Using I/Q Branches Unsymmetrically

During reception a signal is typically decoded in a demodulator having inphase and quadrature branches. These branches are made as symmetrical as possible in traditional receivers in order to minimize errors in the cancellation of the local oscillator signal. For example, the frequency and gain are traditionally the same for both branches. However, in the electromagnetic signature of a lightning strike lightning there is no phase information, so lightning detection can be made on the basis of only signal magnitude and envelope shape. Therefore it is possible to use the I and Q branches of the receiver separately i.e. the receiver can be modified so that the lightning detector utilizes two channels which detect different characteristics of the signal.

Using Different LO Frequency in I/Q Branches

Figure 9:
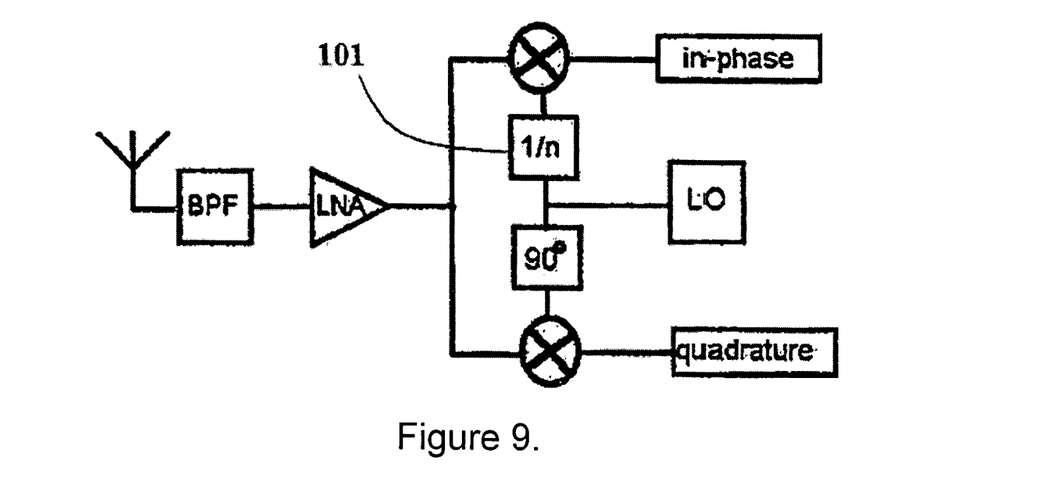
FIG. 9 presents another block diagram of a modified receiver modulator with lightning detection and
FIG. 10 is a lightning data graph.

A typical dual branch I/Q demodulator can be arranged in one mode to be used to detect lightning strikes on different frequencies while in another normal mode functioning traditionally, especially if the arrangement does not affect the precise branch balance in this normal use. For example, and as depicted by FIG. 9, the local oscillator frequency to one branch can be changed using digital means, e.g. using a programmable counter 101 that adjusts the local oscillator signal. Using the phase and quadrature branches of an I/Q demodulator in this way is equivalent to having two different radio receivers operating on different frequencies and is a very cost effective way to implement simple multiple receivers.

Using Different Gain in I/Q Branches

Figure 11:
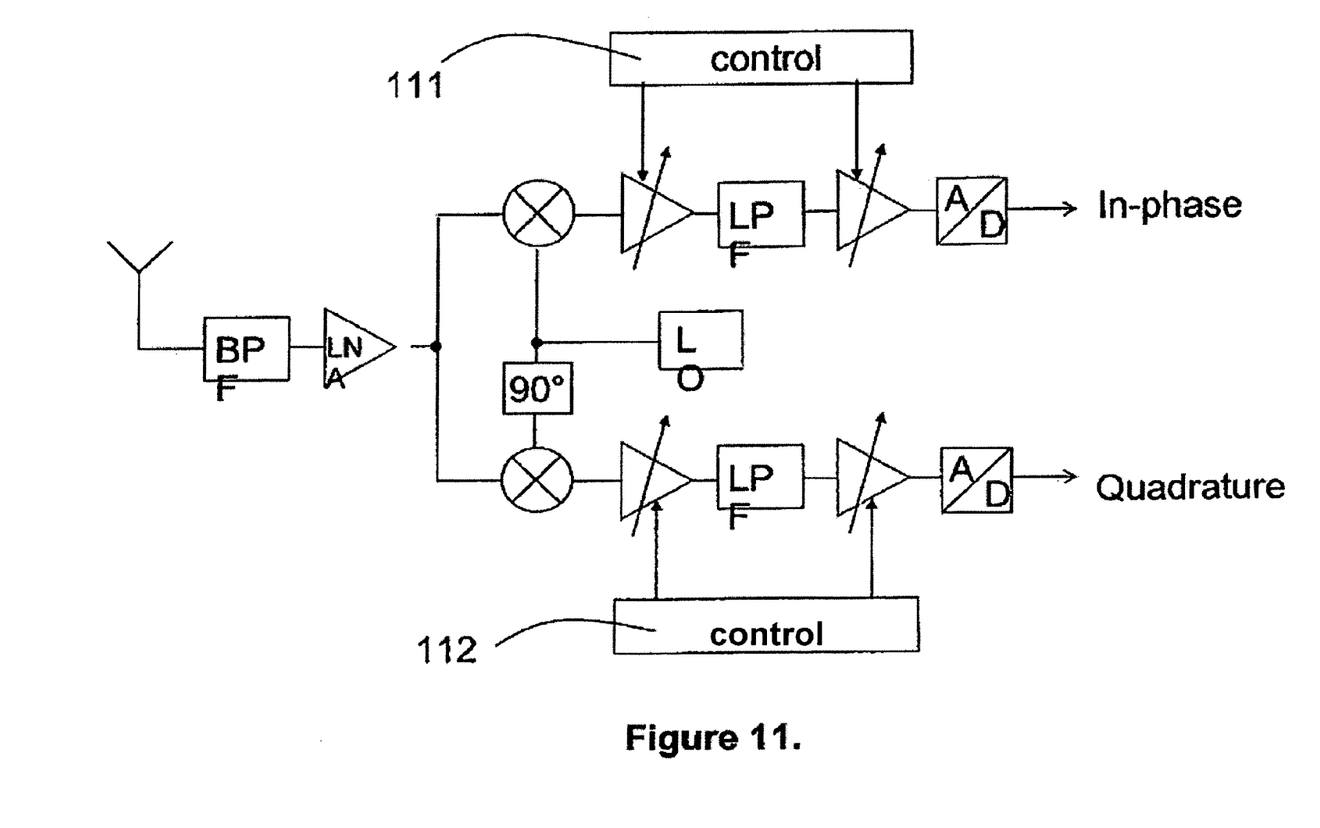
FIG. 11 depicts a modified I/Q demodulator.

A typical dual branch I/Q demodulator can further be arranged in a one mode to operate with different gain on each branch while in another mode it functions normally for broadcast reception. This is depicted in FIG. 11 where the control means 111 and 112 adjusts the gain in the in-phase respective the quadrature branches. Because the amplitude of lightning stroke signals shows huge variations, this is a very effective way to implement far and near detection of lightning strikes and this method can also advantageously be used for triggering in the previously discussed monitor mode.

Using One Branch in Baseband Mode

Figure 12:
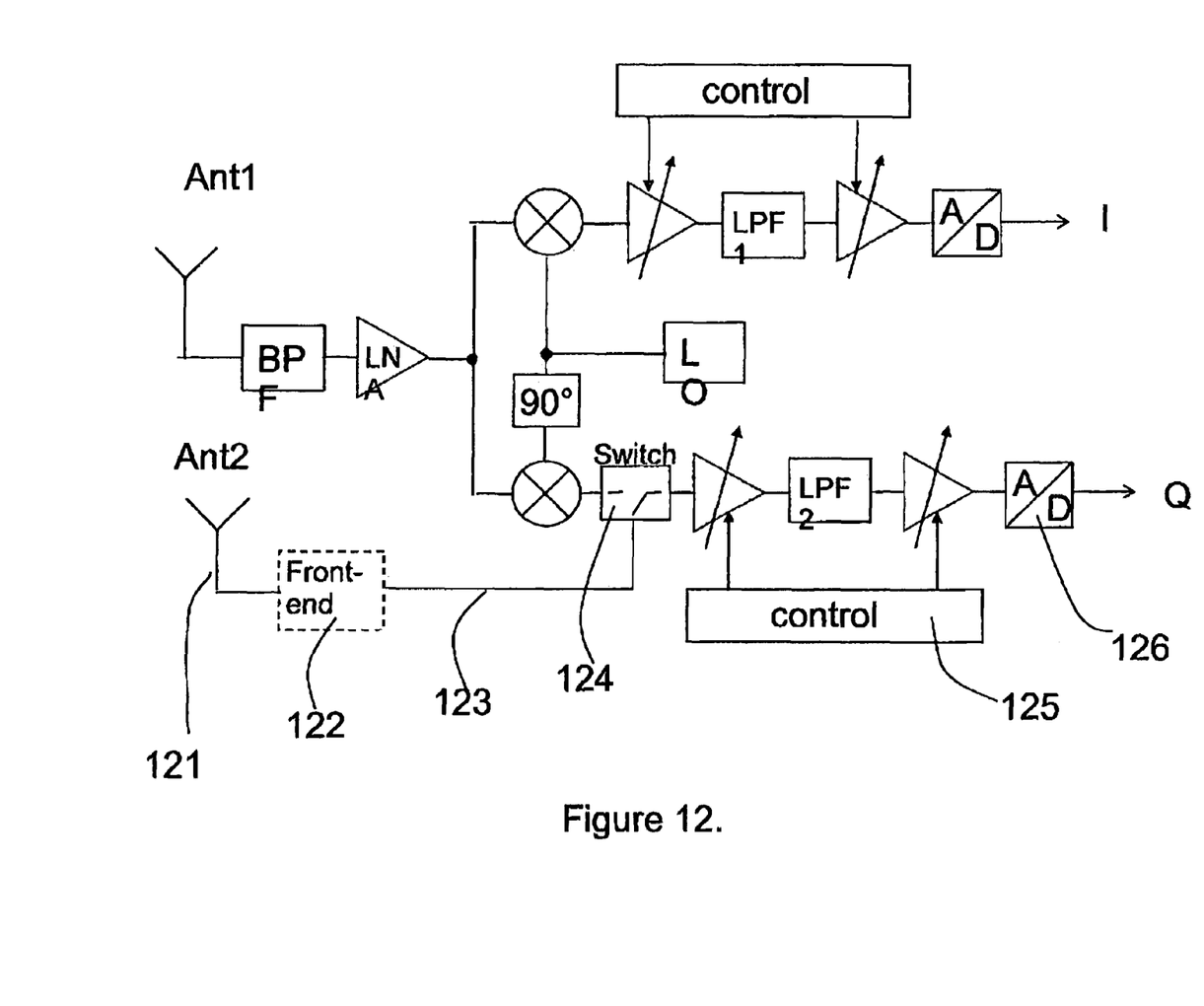
FIG. 12 depicts a modified I/Q demodulator with a switch.

FIG. 12 depicts how one branch can be used in baseband mode without any frequency conversion and is very efficient to receive lightning strikes, which according to the graph depicted by FIG. 9 is rich in low frequency energy, especially at low frequencies 91. A suitable longer wire antenna 121, for example a headset wire antenna, can advantageously be used this way. The use of the amplification, filtering and data conversion 126 means in the branch can thus very cost effectively be used to advantage if a switch 124 is arranged for a signal from the front end 122 or directly from the antenna is switched into the amplification and filtering path by the switch 124 to be converted by the analog to digital converter 126 in FIG. 12. A suitable gain for the amplification and filtering path when used for this purpose can be selected using the controller 125.

It is obvious to a person skilled in the art that different embodiments of the invention are not limited to the examples described above, but that these may be varied within the scope of the enclosed terms.

The invention claimed is:

1. A lightning detector configured to use at least two separate channels or frequency bands for lightning detection, wherein the emission from a lightning stroke is a wideband burst, and wherein the lightning detector is a mobile radio frequency device comprising radio interfaces for the at least two communication channels or frequency bands, wherein at least one of which is normally a telecom channel/frequency range and wherein these channels/ranges are used in lightning detection, wherein at least two channels or a complete frequency band reserved for telecommunication is configured to provide a triggering mode and wherein at least one of the channels is a frequency modulation frequency channel, said lighting detector being configured to use two separate radio interfaces, a main lightning detection radio interface and another radio interface that is configured to use less power, but is less accurate than the main lightning detection radio interface.

2. A lightning detector according to claim 1, configured to by-pass at least a limiter stage of a frequency modulation demodulator, and demodulate a signal resulting from the by-passing, whereby the disturbance originating from lightning strokes can be analyzed.

3. A lightning detector according to claim 2, configured to amplitude modulation demodulate the resulting signal.

4. A lightning detector according to claim 1, wherein the detector comprises a frequency modulation demodulator/receiver and an additional lightning stroke detector is arranged in parallel with the frequency modulation demodulator/receiver.

5. A lightning detector according to claim 4, wherein a lightning detector hardware is added after a down-conversion mixer and before limiter stage in frequency modulation radio receiver.

6. A lightning detector according to claim 1, wherein an empty frequency modulation channel is configured to be used for lightning detection, and that the detector has an intermediate output after down-mixer in the frequency modulation receiver.

7. A lightning detector according to claim 1, wherein the lightning detector features simultaneous lightning detection and reception of frequency modulation radio signals.

8. A lightning detector according to claim 1, wherein an automatic gain control stage of an frequency modulation receiver is configured to be used in lightning detection.

9. A lightning detector according to claim 1, wherein only one radio interface of the radio interfaces for at least two communication channels or frequency bands is configured to be utilised during the detection.

10. A lightning detector according to claim 1, wherein the less power consuming radio interface is configured to be used in triggering mode.

11. A lightning detector according to claim 1, wherein an in-phase and quadrature demodulator is configured to be used to detect lightning strikes while still in another mode functioning normally.

12. A lightning detector according to claim 1, wherein an in-phase and quadrature demodulator of the mobile radio frequency device is used in in-phase and quadrature branches with different local oscillator frequencies.

13. A lightning detector according to claim 1, wherein an in-phase and quadrature demodulator of the mobile radio frequency device is configured to be used in in-phase and quadrature branches with different branch gains.

14. A lightning detector according to claim 1, where the less power consuming radio interface is a radio frequency identification tag interface.

15. A method comprising:
using at least two separate channels or frequency ranges for lightning detection wherein the emission from a lightning stroke is a wideband burst,
wherein a lightning detector is a mobile radio frequency device provided with radio interfaces for at least two communication channels or frequency ranges,
wherein at least one of which is normally a telecom channel/frequency range,
wherein these channels/ranges are used in lightning detection, and
wherein at least two channels or a complete frequency band reserved for telecommunication is used at least to provide a triggering mode,
wherein at least one of the bands of the channels is a frequency modulation frequency channel, said method comprising
using two separate radio interfaces, a main lighting detection radio interface and another radio interface that is configured to use less power, but is less accurate than the main lightning detection radio interface.

16. A method according to claim 15, wherein at least a limiter stage of a frequency modulation demodulator, is by-passed and a signal resulting from the by-passing is demodulated, so that the disturbance originating from lightning strokes is analyzed.

17. A method according to claim 16, wherein the resulting signal is amplitude modulation demodulated.

18. A method according to claim 15, wherein characterised an additional lightning stroke detector is arranged in parallel with the frequency modulation demodulator/receiver.

19. A method according to claim 18, wherein a lightning detector hardware is added after a down-conversion mixer and before the limiter stage in the frequency modulation radio receiver.

20. A method according to claim 15, wherein an empty frequency modulation channel is used for lightning detection, wherein the detector has an intermediate output after a down-mixer in the frequency modulation receiver.

21. A method according to claim 15, wherein the lightning detector features simultaneous lightning detection and reception of frequency modulation radio signals.

22. A method according to claim 15, wherein the utilization of an automatic gain control stage of an frequency modulation receiver in lightning detection.

23. A method according to claim 15, wherein that only one radio interface of the radio interfaces for at least two communication channels or frequency bands is utilised during the detection.

24. A method according to claim 15, wherein the less power consuming radio interface is used in triggering mode.

25. A method according to claim 15, wherein an in-phase and quadrature demodulator is used to detect lightning strikes while still in another mode is functioning normally.

26. A method according to claim 15, wherein a man-made noise elimination is implemented as a software function that is capable of finding fixed interval peaks in the received signal and filtering them away.

27. A method according to claim 26, wherein during the man-made noise the lightning detection is switched off.

28. A method according to claim 15, wherein a choice of detection modes and channels is used to optimize device power usage.

29. A method according to claim 28, wherein the device is a mobile radio frequency device, and that the choice is taken into account which channels are available; wherein when a given radio channel is in use, another available radio channel is used.

30. A method according to claim 15, wherein an in-phase and quadrature demodulator of the mobile radio frequency device is configured to be used in in-phase and quadrature branches with different local oscillator frequencies.

31. A method according to claim 15, wherein an in-phase and quadrature demodulator of the mobile radio frequency device is configured to be used in in-phase and quadrature branches with different branch gains.

32. A method according to claim 15, where the less power consuming radio interface is a radio frequency identification tag interface.

* * * * *